United States Patent
Okumura

(10) Patent No.: US 8,130,295 B2
(45) Date of Patent: Mar. 6, 2012

(54) ANALOG-TO-DIGITAL CONVERTER, SOLID-STATE IMAGE PICKUP DEVICE, AND CAMERA SYSTEM

(75) Inventor: Kenichi Okumura, Kanagawa (JP)

(73) Assignee: Sony Corporation, Tokyo (JP)

( * ) Notice: Subject to any disclaimer, the term of this patent is extended or adjusted under 35 U.S.C. 154(b) by 425 days.

(21) Appl. No.: 12/391,062

(22) Filed: Feb. 23, 2009

(65) Prior Publication Data

US 2009/0237534 A1   Sep. 24, 2009

(30) Foreign Application Priority Data

Mar. 18, 2008   (JP) ................... 2008-070011

(51) Int. Cl.
*H04N 5/335*   (2011.01)
*H04N 3/14*   (2006.01)
*H03M 1/12*   (2006.01)
*H03M 1/50*   (2006.01)

(52) U.S. Cl. ........ 348/294; 341/155; 341/168; 341/166; 348/302

(58) Field of Classification Search ............... 250/208.1; 257/290, 291; 341/155, 166, 168; 348/294, 348/302
See application file for complete search history.

(56) References Cited

U.S. PATENT DOCUMENTS

| 2005/0195304 A1 | 9/2005 | Nitta et al. |
| 2005/0242849 A1 | 11/2005 | Muramatsu et al. |
| 2009/0237535 A1* | 9/2009 | Okumura ................ 348/294 |

FOREIGN PATENT DOCUMENTS

| JP | 59-115621 | 7/1984 |
| JP | 04-172274 | 6/1992 |
| JP | 2005-278135 | 10/2005 |
| JP | 2005-311933 | 11/2005 |

* cited by examiner

*Primary Examiner* — David N Spector
(74) *Attorney, Agent, or Firm* — Robert J. Depke; Rockey, Depke & Lyons, LLC

(57) ABSTRACT

An analog-to-digital converter converting an analog input signal into a digital signal includes a comparator comparing a reference signal with an input signal and, if the reference signal matches the input signal, inverting an output; and a counter counting a comparison time. The counter includes flip flops that perform serial input/output. An input and an output of the counter are interconnected. The counter operates in a counter mode and a shift register mode. In the counter mode, a data output of each flip flop is supplied to a clock input of the next flip flop, and, if the output of the comparator is at a predetermined level, the counter functions as a counter synchronized with a counter clock signal. In the shift register mode, the flip flops are cascade-connected, and the counter functions as a shift register synchronized with a shift register clock signal.

16 Claims, 11 Drawing Sheets

10

US 8,130,295 B2

ANALOG-TO-DIGITAL CONVERTER, SOLID-STATE IMAGE PICKUP DEVICE, AND CAMERA SYSTEM

The present application claims priority to Japanese Patent Application JP2008-070011, filed in the Japanese Patent Office Mar. 18, 2008; the entire contents of which is incorporated herein by reference.

BACKGROUND OF THE INVENTION

1. Field of the Invention

The present invention relates to an analog-to-digital (AD) converter applicable to a solid-state image pickup device represented by, for example, a complementary metal-oxide-semiconductor (CMOS) image sensor, a solid-state image pickup device including the AD converter, and a camera system.

2. Description of the Related Art

In recent years, CMOS image sensors have been drawing attention as solid-state image pickup devices (image sensors), in place of charge-coupled device (CCD) image sensors.

This is because CMOS image sensors overcome the problems of CCD image sensors, including that a dedicated manufacturing process is necessary for fabricating CCD pixels, a plurality of power supply voltages are necessary for the operation of a CCD image sensor, and a system including the CCD image sensor becomes very complicated due to the necessity of operating a plurality of peripheral integrated circuits (ICs) in a combined manner.

CMOS image sensors can be manufactured using a process similar to the process of manufacturing general CMOS ICs. Also, a CMOS image sensor can be driven by a single power supply. Furthermore, an analog circuit and a logic circuit using CMOS processes can be mixed in a single chip, resulting in a reduction of the number of peripheral ICs. That is, CMOS sensors have great advantages.

An output circuit of a CCD image sensor is generally a 1-channel (ch) output using a floating diffusion (FD) amplifier with an FD.

In contrast, a CMOS image sensor has an FD amplifier in each pixel and generally uses a column-parallel output scheme that selects a row from an array of pixels and simultaneously outputs signals read from the selected row of pixels in a column direction.

Because it is difficult to obtain sufficient drive power using the FD amplifiers arranged in the pixels, the date rate is necessary to be dropped. In this regard, parallel processing is considered to be advantageous.

A general CMOS image sensor will now be described below.

FIG. 1 shows an example of a pixel in a CMOS image sensor, the pixel including four transistors.

A pixel 10 includes, for example, a photodiode 11 serving as a photoelectric transducer. The pixel 10 has four transistors for the photodiode 11, namely, a transfer transistor 12, an amplifying transistor 13, a selecting transistor 14, and a reset transistor 15, which serve as active elements.

The photodiode 11 converts incident light into electric charge (electrons in this example) whose amount is in accordance with the quantity of the incident light.

The transfer transistor 12 is connected between the photodiode 11 and an FD. By supplying a drive signal to a gate (transfer gate) of the transfer transistor 12 through a transfer control line LTx, the electrons obtained by photoelectric conversion using the photodiode 11 are transferred to the FD.

A gate of the amplifying transistor 13 is connected to the FD. The amplifying transistor 13 is connected to a signal line LSGN via the selecting transistor 14 and, together with a constant current source 16 provided outside the pixel 10, constitutes a source follower.

An address signal is supplied to a gate of the selecting transistor 14 through a selection control line LSEL. When the selecting transistor 14 is turned ON, the amplifying transistor 13 amplifies the potential of the FD and outputs a voltage in accordance with the potential to the output (vertical) signal line LSGN. A signal voltage output from the pixel 10 is output through the signal line LSGN to a pixel-signal reading circuit.

The reset transistor 15 is connected between a power supply line LVDD and the FD. By supplying a reset signal to a gate of the reset transistor 15 through a reset control line LRST, the reset transistor 15 resets the potential of the FD to the potential of the power supply line LVDD.

More specifically, when resetting the pixel 10, the transfer transistor 12 is turned ON, thus discharging the electric charge accumulated in the photodiode 11. Next, the transfer transistor 12 is turned OFF, and the photodiode 11 converts an optical signal into electric charge, and accumulates the electric charge.

At the time of reading, the reset transistor 15 is turned ON, thus resetting the FD. Then, the reset transistor 15 is turned OFF, and the voltage of the FD at that point is output via the amplifying transistor 13 and the selecting transistor 14. This output serves as a P-phase output.

Next, the transfer transistor 12 is turned ON, thus transferring the electric charge accumulated in the photodiode 11 to the FD. The voltage of the FD at that point is output via the amplifying transistor 13. This output serves as a D-phase output.

A difference between the D-phase output and the P-phase output serves as an image signal. Accordingly, not only variations in direct current (DC) components of outputs of the pixels, but also FD reset noise can be removed from the image signal.

These operations are performed at the same time for all pixels included in one row since, for example, the gates of the transfer transistor 12, the selecting transistor 14, and the reset transistor 15 are interconnected on a row-by-row basis.

Various types of pixel-signal reading (output) circuits in column-parallel-output CMOS image sensors have been proposed. One of the most advanced types is the type that includes an analog-to-digital converter (hereinafter abbreviated as "ADC") in each column, and that obtains a pixel signal as a digital signal.

CMOS image sensors with such column-parallel ADCs are disclosed in, for example, W. Yang, et al., "An Integrated 800×600 CMOS Image System," ISSCC Digest of Technical Papers, pp. 304-305, February 1999, and in Japanese Unexamined Patent Application Publication Nos. 2005-278135 and 2005-311933.

FIG. 2 is a block diagram showing an exemplary structure of a solid-state image pickup device (CMOS image sensor) with column-parallel ADCs.

A solid-state image pickup device 20 includes, as shown in FIG. 2, a pixel section 21 serving as an image pickup section, a vertical scanning circuit 22, a horizontal transfer/scanning circuit 23, a timing control circuit 24, an ADC group 25, a digital-to-analog converter (hereinafter abbreviated as "DAC") 26, an amplifier (sample/hold (S/H)) circuit 27, and a signal processing circuit 28.

The pixel section 21 includes pixels arranged in a matrix. Each pixel includes a photodiode and a built-in amplifier, for example, as shown in FIG. 1.

In the solid-state image pickup device 20, the timing control circuit 24 for generating an internal clock signal, the vertical scanning circuit 22 for controlling row addresses and row scanning, and the horizontal transfer/scanning circuit 23 for controlling column addresses and column scanning are arranged as control circuits for sequentially reading signals from the pixel section 21.

The ADC group 25 includes a plurality of columns of ADCs. Each ADC includes a comparator 25-1 that compares a reference voltage Vslop, which has a ramp waveform obtained by changing a reference voltage generated by the DAC 26 to be a stepped voltage, with a corresponding one of analog signals obtained from pixels in each row through respective vertical signal lines; a counter 25-2 that counts a comparison time; and a latch 25-3 that holds the count result.

The ADC group 25 includes column-parallel ADC blocks, each ADC block having an n-bit digital signal converting function. The ADC blocks are arranged in correspondence with respective vertical signal lines (column lines).

An output of each latch 25-3 is connected to, for example, a 2n-bit-width horizontal transfer line 29.

In correspondence with the horizontal transfer line 29, 2n amplifier circuits 27 and signal processing circuits 28 are arranged (only one amplifier circuit 27 and one signal processing circuit 28 are shown in FIG. 2).

In the ADC group 25, each of the comparators 25-1, which are arranged in respective columns, compares an analog signal read to a corresponding vertical signal line with the reference voltage Vslop (slope waveform that has a certain slope and changes linearly).

On this occasion, the counters 25-2, which are arranged in respective columns, as with the comparators 25-1, are operating. When the potential Vslop having the ramp waveform and a counter value change with a one-to-one correspondence, a potential of the vertical signal line (analog signal) Vsl is converted into a digital signal.

A change in the reference voltage Vslop is for converting a change in voltage into a change in time. By counting that time using a certain cycle (clock), the voltage can be converted into a digital value.

When the analog electric signal Vsl intersects the reference voltage Vslop, the output of the comparator 25-1 is inverted. Inputting of a clock signal to the counter 25-2 is terminated, and accordingly, AD conversion is completed.

After the above-described AD conversion period, the horizontal transfer/scanning circuit 23 inputs data held in the latch 25-3 via the horizontal transfer line 29 and the amplifier circuit 27 to the signal processing circuit 28, thereby generating a two-dimensional image.

In this manner, column-parallel output processing is performed.

Japanese Unexamined Patent Application Publication No. 59-115621 discloses a logic circuit that enables a counter circuit to perform a shift register operation using flip flops FF.

SUMMARY OF THE INVENTION

CMOS image sensors perform complicated arithmetic processing including pixel addition and noise processing, as has been described above.

The arithmetic processing is performed by a logic circuit subsequent to AD conversion, and by an external signal processing circuit (IC).

With this method, however, as the number of pixels in an image sensor increases and the frame rate increases, the signal processing speed and power consumption are increased, thus causing serious problems.

One method to solve the problems is a method of performing arithmetic processing using an ADC, such as that disclosed in Japanese Unexamined Patent Application Publication No. 2005-311933.

However, this technique is only applicable to simple processing such as correlated double sampling (CDS).

Also, as has been described above, Japanese Unexamined Patent Application Publication No. 59-115621 discloses a logic circuit that enables a counter circuit to perform a shift register operation using flip flops FF. Also, Japanese Unexamined Patent Application Publication Nos. 2005-278135 and 2005-311933 disclose the techniques of inverting a counter value.

However, the combination of these techniques can only perform simple operations and reading of the counter value, and the counter value is not reusable. Furthermore, the combination of these techniques has difficulty in performing more complicated processing.

The present invention provides an analog-to-digital converter (ADC) that can perform complicated processing while a counter and a latch (memory) can input/output a counter value to/from each other and perform operations on the counter value.

According to an embodiment of the present invention, there is provided an analog-to-digital converter that converts an analog input signal into a digital signal, including the following elements: a comparator configured to compare a reference signal with an input signal and, if the reference signal matches the input signal, invert an output; and a counter configured to count a comparison time of the comparator. The counter includes a plurality of flip flops that can perform serial input/output, an input and an output of the counter are connected to each other, and the counter can operate in accordance with a counter mode and a shift register mode. In the counter mode, a data output of each of the plurality of flip flops is supplied to a clock input of a flip flop at a next stage, and, if the output of the comparator is at a predetermined level, the counter functions as a counter synchronized with a counter clock signal. In the shift register mode, the plurality of flip flops are cascade-connected, and the counter functions as a shift register synchronized with a shift register clock signal.

Preferably, the analog-to-digital converter further includes an inverter on a connection line between the output and the input of the counter.

Preferably, the analog-to-digital converter further includes a digital processor on a connection line between the output and the input of the counter.

Preferably, the analog-to-digital converter further includes a latch connected via a switch to an output side of the plurality of flip flops.

Preferably, an initial value of the counter can be selectively input to the connection line.

According to an embodiment of the present invention, there is provided a solid-state image pickup device including the following elements: a pixel section including a plurality of pixels arranged in a matrix, the plurality of pixels performing photoelectric conversion; and a pixel-signal reading circuit configured to read pixel signals from the pixel section in increments of multiple pixels. The pixel-signal reading circuit includes the following elements: a plurality of comparators arranged in correspondence with respective columns of the matrix of the plurality of pixels, each of the plurality of comparators comparing a voltage of a read signal input to the comparator with a voltage of a reference signal, and, if the voltage of the reference signal matches the voltage of the input signal, inverting an output; and a plurality of counters whose operation is controlled in accordance with the outputs of the plurality of comparators, respectively, each of the plurality of counters counting a comparison time of a corresponding one of the plurality of comparators. Each of the plurality of counters includes a plurality of flip flops that can perform serial input/output, an input and an output of the counter are connected to each other, and the counter can operate in accordance with a counter mode and a shift register mode. In the counter mode, a data output of each of the plurality of flip flops is supplied to a clock input of a flip flop at a next stage, and, if the output of the comparator is at a predetermined level, the counter functions as a counter synchronized with a counter clock signal. In the shift register mode, the plurality of flip flops are cascade-connected, and the counter functions as a shift register synchronized with a shift register clock signal.

Preferably, the solid-state image pickup device further includes a plurality of adders configured to add outputs of counters in adjacent columns.

According to an embodiment of the present invention, there is provided a camera system including the following elements: a solid-state image pickup device; and an optical system that forms an optical image of a subject on the solid-state image pickup device. The solid-state image pickup device includes the following elements: a pixel section including a plurality of pixels arranged in a matrix, the plurality of pixels performing photoelectric conversion; and a pixel-signal reading circuit configured to read pixel signals from the pixel section in increments of multiple pixels. The pixel-signal reading circuit includes the following elements: a plurality of comparators arranged in correspondence with respective columns of the matrix of the plurality of pixels, each of the plurality of comparators comparing a voltage of a read signal input to the comparator with a voltage of a reference signal, and, if the voltage of the reference signal matches the voltage of the input signal, inverting an output; and a plurality of counters whose operation is controlled in accordance with the outputs of the plurality of comparators, respectively, each of the plurality of counters counting a comparison time of a corresponding one of the plurality of comparators. Each of the plurality of counters includes a plurality of flip flops that can perform serial input/output, an input and an output of the counter are connected to each other, and the counter can operate in accordance with a counter mode and a shift register mode. In the counter mode, a data output of each of the plurality of flip flops is supplied to a clock input of a flip flop at a next stage, and, if the output of the comparator is at a predetermined level, the counter functions as a counter synchronized with a counter clock signal. In the shift register mode, the plurality of flip flops are cascade-connected, and the counter functions as a shift register synchronized with a shift register clock signal.

According to the embodiments of the present invention, in an analog-to-digital converter using a comparator and a counter, the counter has the function of a shift register. A connection line (bus wiring) connecting an input terminal to an output terminal of the counter is formed. On the bus, for example, an inverter or a digital processor (e.g., a 1-bit processor) is connected. The counter and the memory input/output a counter value to/from each other and perform operations on the counter value, whereby complicated processing is performed.

According to the embodiments of the present invention, a counter and a latch (memory) can input/output a counter value to/from each other and perform operations on the counter value, whereby complicated processing can be performed.

DESCRIPTION OF THE PREFERRED EMBODIMENTS

Embodiments of the present invention will now herein be described below with reference to the drawings.

Figure 3:
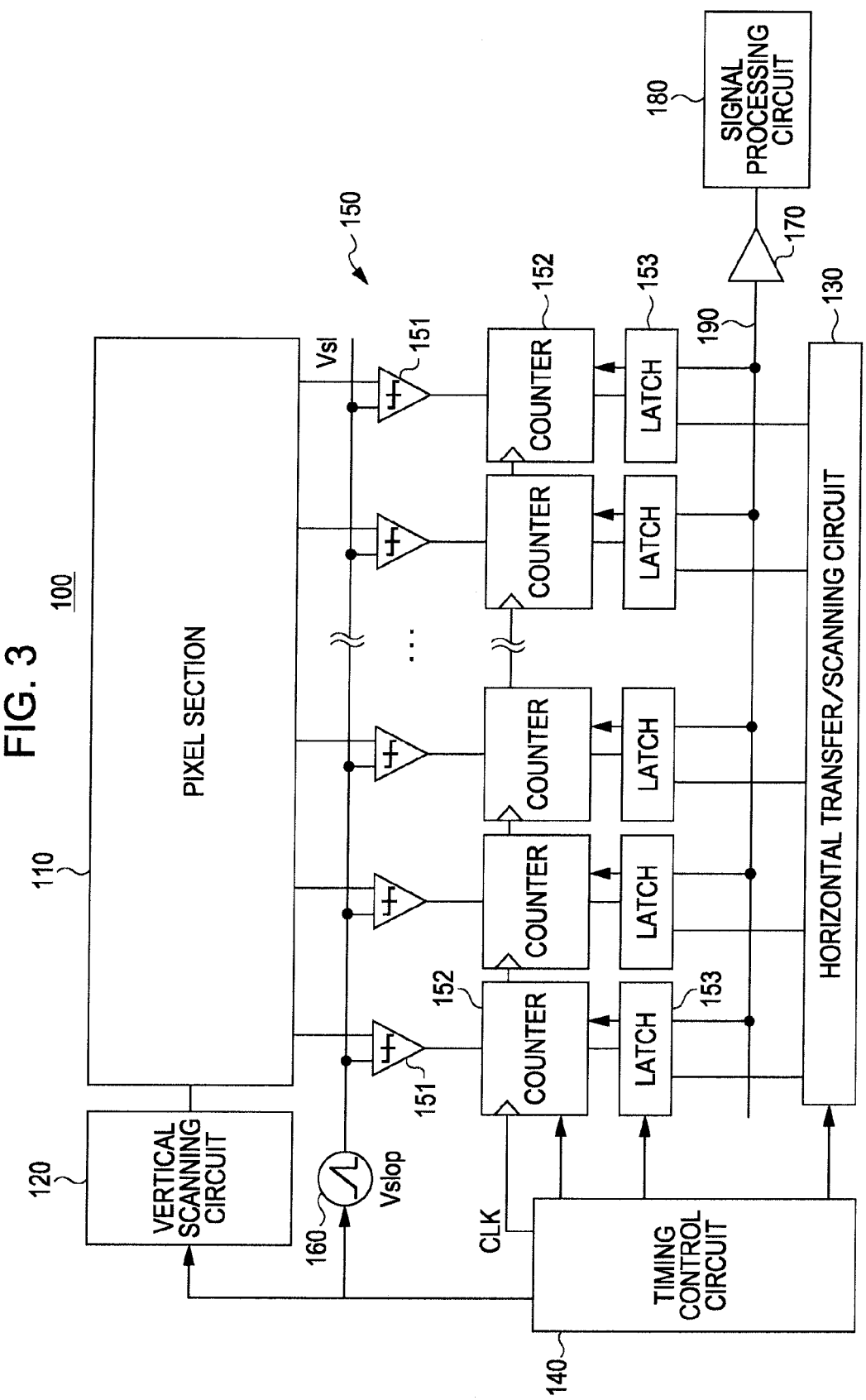
FIG. 3 is a block diagram showing an exemplary structure of a solid-state image pickup device (CMOS image sensor) with column-parallel ADCs according to an embodiment of the present invention.

FIG. 3 is a block diagram showing an exemplary structure of a solid-state image pickup device (CMOS image sensor) with column-parallel ADCs according to an embodiment of the present invention.

A solid-state image pickup device 100 includes, as shown in FIG. 3, a pixel section 110 serving as an image pickup section, a vertical scanning circuit 120, a horizontal transfer/scanning circuit 130, a timing control circuit 140, an ADC group 150 serving as a pixel-signal reading circuit, a DAC 160, an amplifier (S/H) circuit 170, a signal processing circuit 180, and a horizontal transfer line 190. In the ADC group 150, a plurality of ADCs are arranged in parallel.

Figure 1:
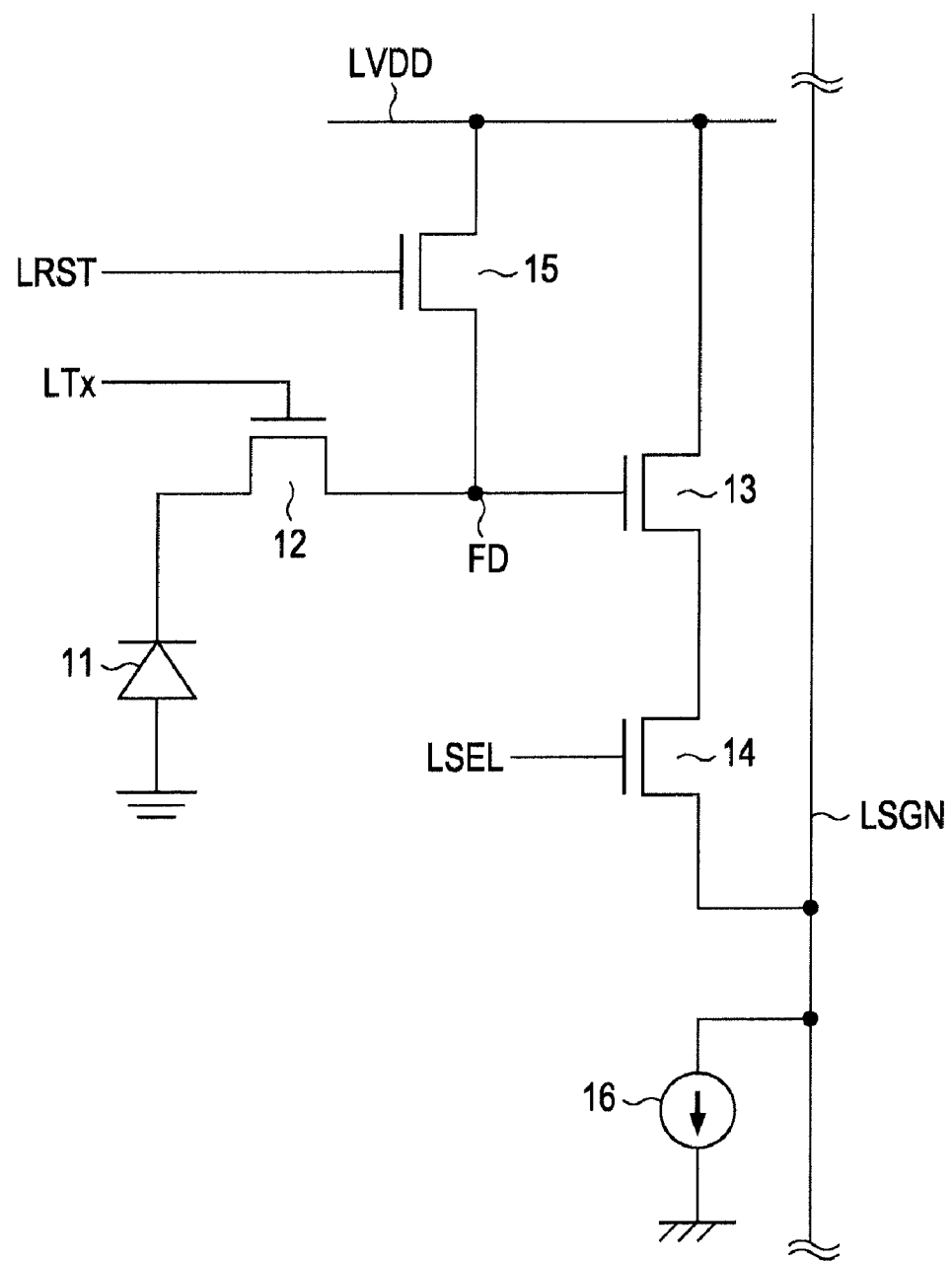
FIG. 1 is a diagram showing an example of a pixel in a CMOS image sensor, the pixel including four transistors.
Figure 2:
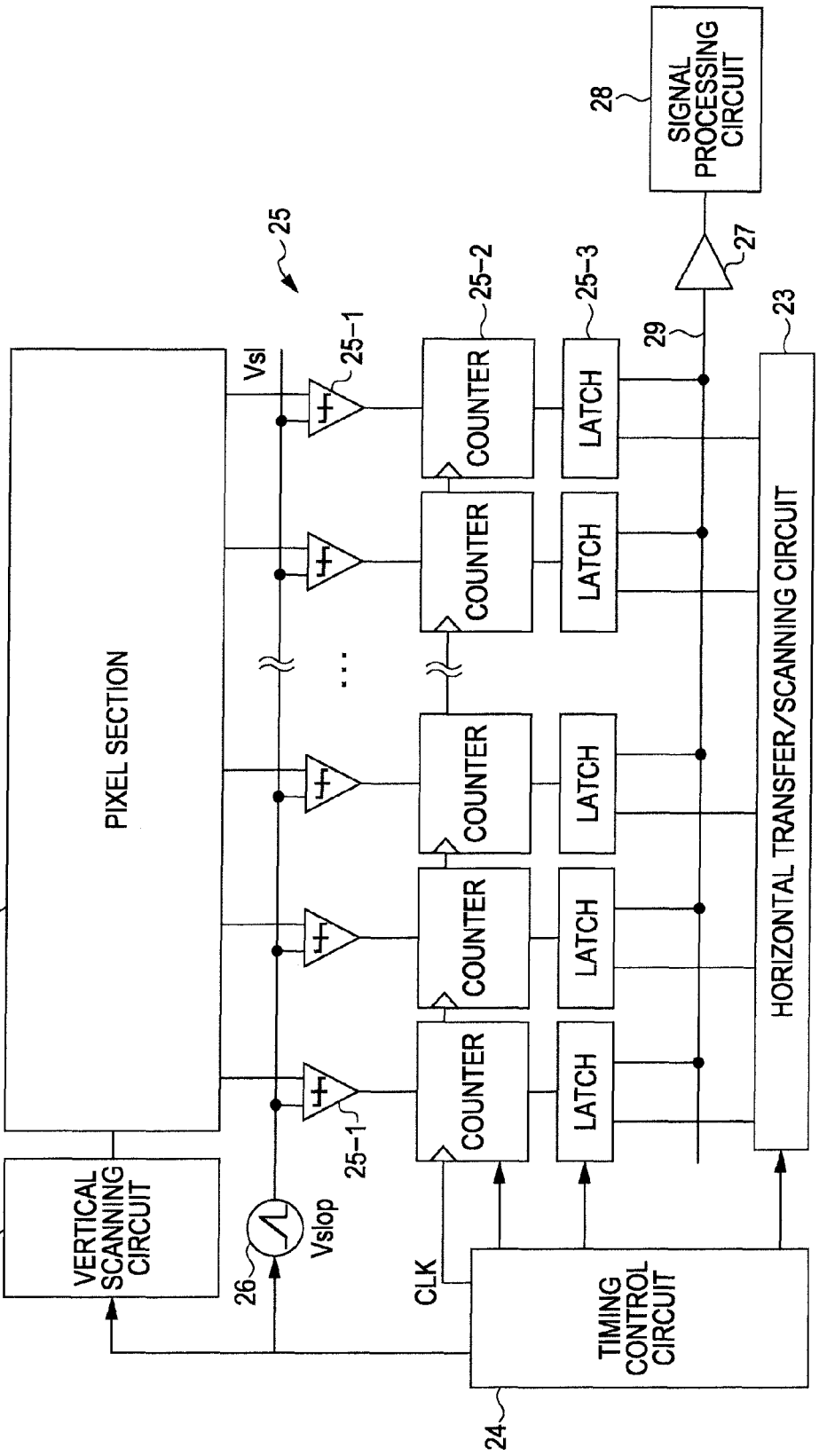
FIG. 2 is a block diagram showing an exemplary structure of a solid-state image pickup device (CMOS image sensor) with column-parallel ADCs.

The pixel section 110 includes pixels arranged in a matrix. Each pixel includes a photodiode and a built-in amplifier, for example, as shown in FIG. 1.

In the solid-state image pickup device 100, the timing control circuit 140 for generating an internal clock signal, the vertical scanning circuit 120 for controlling row addresses and row scanning, and the horizontal transfer/scanning circuit 130 for controlling column addresses and column scanning are arranged as control circuits for sequentially reading signals from the pixel section 110.

The ADC group 150 basically includes a plurality of columns of ADCs. Each ADC includes a comparator 151 that compares a reference voltage Vslop, which has a ramp waveform obtained by changing a reference voltage generated by the DAC 160 to be a stepped voltage, with a corresponding one of analog signals (potential Vsl) obtained from pixels in each row through respective vertical signal lines; a counter 152 that counts a comparison time; and a latch 153 that holds the count result and includes, for example, an N-bit memory.

The ADC group 150 includes column-parallel ADC blocks, each ADC block having an n-bit digital signal converting function. The ADC blocks are arranged in correspondence with respective vertical signal lines (column lines).

An output of each latch 153 is connected to, for example, the 2n-bit-width horizontal transfer line 190.

In correspondence with the horizontal transfer line 190, 2n amplifier circuits 170 and signal processing circuits 180 are arranged (only one amplifier circuit 170 and one signal processing circuit 180 are shown in FIG. 3).

In the ADC group 150, each of the comparators 151, which are arranged in respective columns, compares an analog pixel signal Vsig (potential Vsl) read to a corresponding vertical signal line with the reference voltage Vslop (slope waveform or ramp waveform that has a certain slope and changes linearly).

On this occasion, the counters 152, which are arranged in respective columns, as with the comparators 151, are operating. When the potential Vslop having the ramp waveform and a counter value change with a one-to-one correspondence, a potential of the vertical signal line (analog signal) Vsl is converted into a digital signal.

A change in the reference voltage Vslop is for converting a change in voltage into a change in time. By counting that time using a certain cycle (clock), the voltage can be converted into a digital value.

When the analog electric signal Vsl intersects the reference voltage Vslop, the output of the comparator 151 is inverted. Inputting of a clock signal to the counter 152 is terminated, or inputting of a clock signal to the counter 152, which has been terminated, is resumed. Accordingly, AD conversion is completed.

After the above-described AD conversion period, the horizontal transfer/scanning circuit 130 inputs data held in the latch 153 via the horizontal transfer line 190 and the amplifier circuit 170 to the signal processing circuit 180, thereby generating a two-dimensional image by performing predetermined signal processing.

Each of the ADCs in the ADC group 150 according to the embodiment is an ADC that can perform complicated processing while the counter 152 and the latch (memory) 153 can input/output the counter value to/from each other and perform operations on the counter value.

Hereinafter, the structure of each ADC, that is, particularly the structure, functions, arithmetic functions, and the like of each counter, in the ADC group (pixel-signal reading circuit) 150 with a characteristic structure of the embodiment will be described in detail.

First Exemplary Structure

Figure 4:
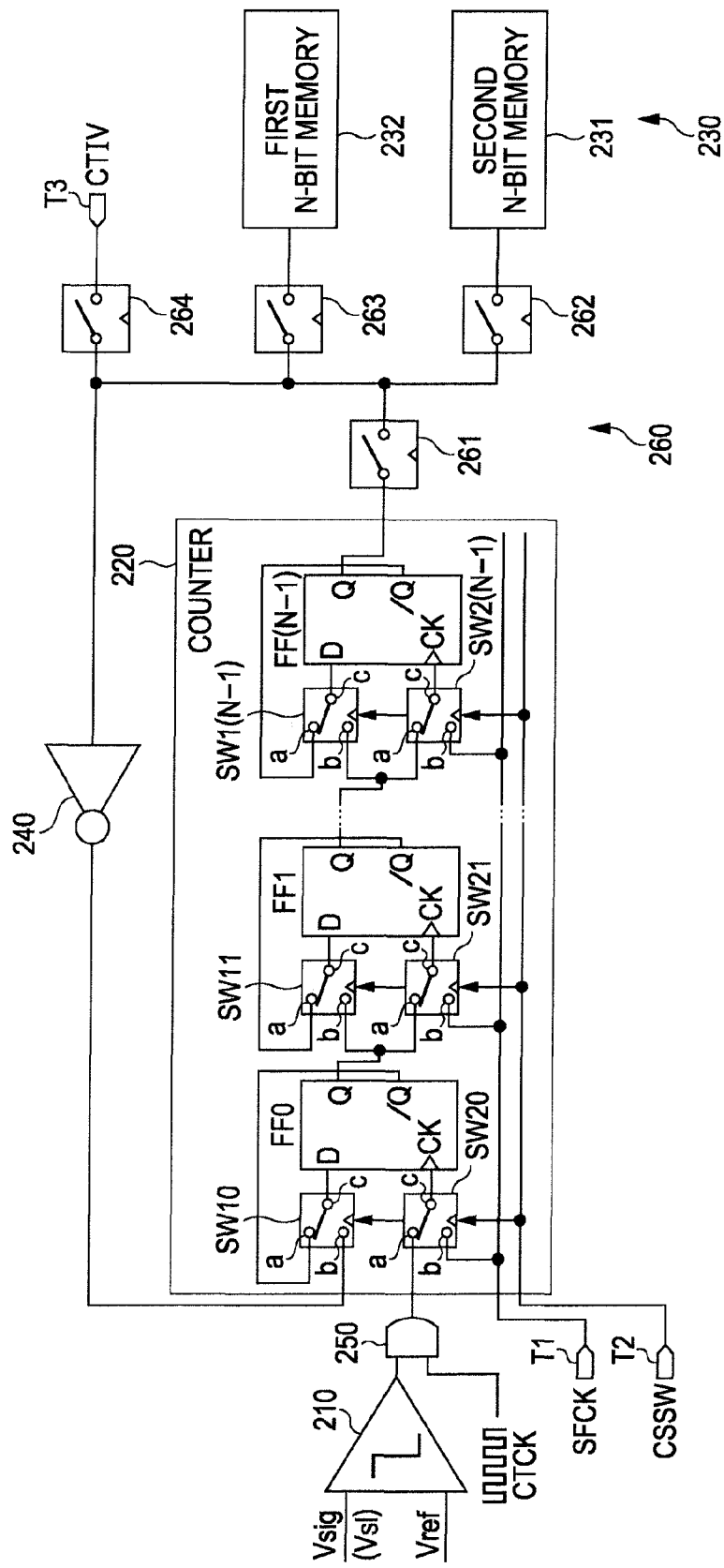
FIG. 4 is a circuit diagram showing a first exemplary structure of an ADC according to the embodiment.

FIG. 4 is a circuit diagram showing a first exemplary structure of the ADC according to the embodiment.

Referring to FIG. 4, an ADC 200 is shown. Also, the comparator 151 shown in FIG. 3 is denoted by reference numeral 210; the counter 152 is denoted by reference numeral 220; and the latch (memory) 153 is denoted by reference numeral 230.

The ADC 200 shown in FIG. 4 includes the comparator 210 (151), the N-bit counter 220 (152) with a serial input/output function, the latch 230 (153) including a first N-bit memory 231 and a second N-bit memory 232, an inverter 240, a 2-input AND gate 250, a switch group 260 including switches 261, 262, 263, and 264, and terminals T1, T2, and T3.

The comparator 210 and the counter 220 constitute the ADC 200.

The comparator 210 compares a reference wave Vref with a pixel signal Vsig. For example, when the pixel signal Vsig reaches the level of the reference wave Vref, that is, when the pixel signal Vsig intersects the reference wave Vref, the comparator 210 switches its output level from high level to low level.

The counter 220 includes flip flops FF0 to FF(N−1) capable of performing serial input/output, switches SW10 to SW1(N−1) arranged at data-input-D input stages of the flip flops FF0 to FF(N−1), respectively, and switches SW20 to SW2(N−1) arranged at clock-input-CK input stages of the flip flops FF0 to FF(N−1), respectively.

In the counter 220, a data output Q of the flip flop FF(N−1) at the final stage is connected to the data input D of the flip flop FF0 at the first stage via the switch 261, the inverter 240, and the switch SW10.

In the counter 220, the switch SW10 has a terminal a connected to an inverted output /Q ("/" indicates inversion) of the flip flop FF0, a terminal b connected to an output of the inverter 240, and a terminal c connected to the data input D of the flip flop FF0.

The switch SW11 has a terminal a connected to an inverted output /Q of the flip flop FF1, a terminal b connected to a data output Q of the flip flop FF0 at the previous stage, and a terminal c connected to the data input D of the flip flop FF1.

Similarly, the switch SW1(N−1) has a terminal a connected to an inverted output /Q of the flip flop FF(N−1), a terminal b connected to a data output Q of the flip flop FF(N−2) at the previous stage, and a terminal c connected to the data input D of the flip flop FF(N−1).

In the counter 220, the switch SW20 has a terminal a connected to an output of the 2-input AND gate 250, a terminal b connected to the input terminal T1 to which a shift register clock signal SFCK is input, and a terminal c connected to the clock input CK of the flip flop FF0.

The switch SW21 has a terminal a connected to the data output Q of the flip flop FF0 at the previous stage, a terminal b connected to the input terminal T1 to which the shift register clock signal SFCK is input, and a terminal c connected to the clock input CK of the flip flop FF1.

Similarly, the switch SW2(N−1) has a terminal a connected to the data output Q of the flip flop FF(N−2) at the previous stage, a terminal b connected to the input terminal T1 to which the shift register clock signal SFCK is input, and a terminal c connected to the clock input CK of the flip flop FF(N−1).

The 2-input AND gate 250 has one input connected to an output of the comparator 210, the other input connected to a line for supplying a counter clock signal CTCK, and an output connected to the terminal b of the switch SW20 in the counter 220.

The switches SW10 to SW1(N−1) and the switches SW20 to SW2(N−1) in the counter 220 are controlled to be switched in response to a counter-shift register switching signal (hereinafter called a "switching signal") CSSW input to the terminal T2.

Regarding the switches SW10 to SW1(N−1) and the switches SW20 to SW2(N−1), if the switching signal CSSW is at a high level (counter mode), the terminal a is connected to the terminal c; if the switching signal CSSW is at a low level (shift register mode), the terminal b is connected to the terminal c.

Figure 5:
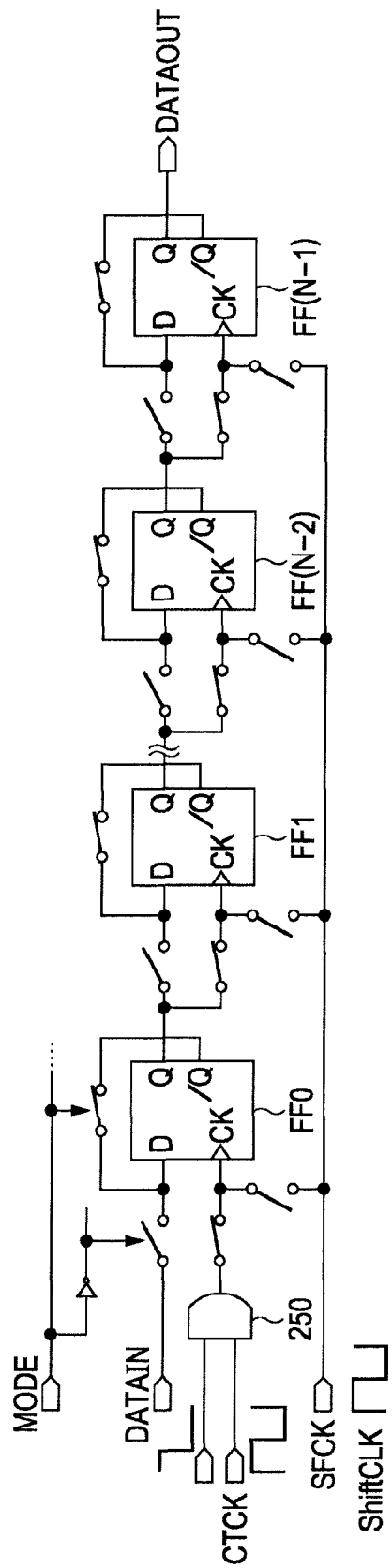
FIG. 5 is a diagram schematically showing a structure including connection states of switches in a counter in a counter mode.

FIG. 5 is a diagram schematically showing a structure including connection states of the switches in the counter in the counter mode.

Figure 6:
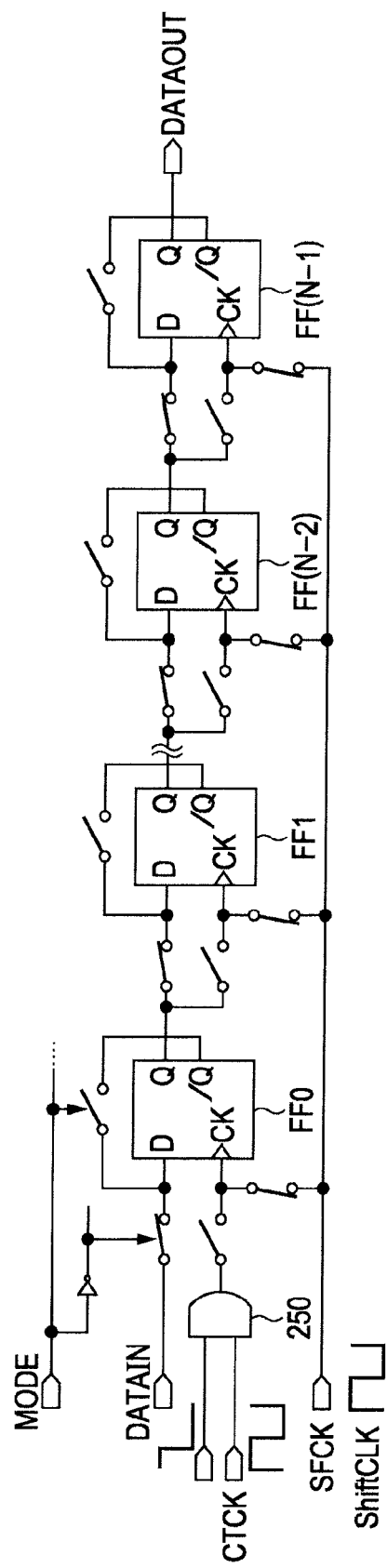
FIG. 6 is a diagram schematically showing a structure including connection states of the switches in the counter in a shift register mode.

FIG. 6 is a diagram schematically showing a structure including connection states of the switches in the counter in the shift register mode.

In the counter 220 in the counter mode, as shown in FIG. 5, when the output of the comparator 210 is at a high level, the flip flop FF0 at the first stage receives a counter clock signal CTCK at the clock input CK and latches inverted output data thereof.

The flip flops FF1 to FF(N−1) at the second stage and onward receive data outputs of the flip flop FF0 to FF(N−2) at the respective previous stages and latch inverted output data thereof.

In the counter 220 in the shift register mode, as shown in FIG. 6, the flip flops FF0 to FF(N−1) are cascade-connected, and a shift register clock signal SFCK is input to the clock inputs CK of the flip flop FF0 to FF(N−1).

An output of the inverter 240 is input to the data input D of the flip flop FF0 at the first stage.

An input of the inverter 240 is connected via the switch 261 to the data output Q of the flip flop FF(N−1) at the final stage in the counter 220, via the switch 262 to the first N-bit memory 231, via the switch 263 to the second N-bit memory 232, and via the switch 264 to the input terminal T3 to which a counter initial value CTIV is input.

In the switch group 260, the switches 261 to 264 are equivalently connected to a signal line.

Figure 7:
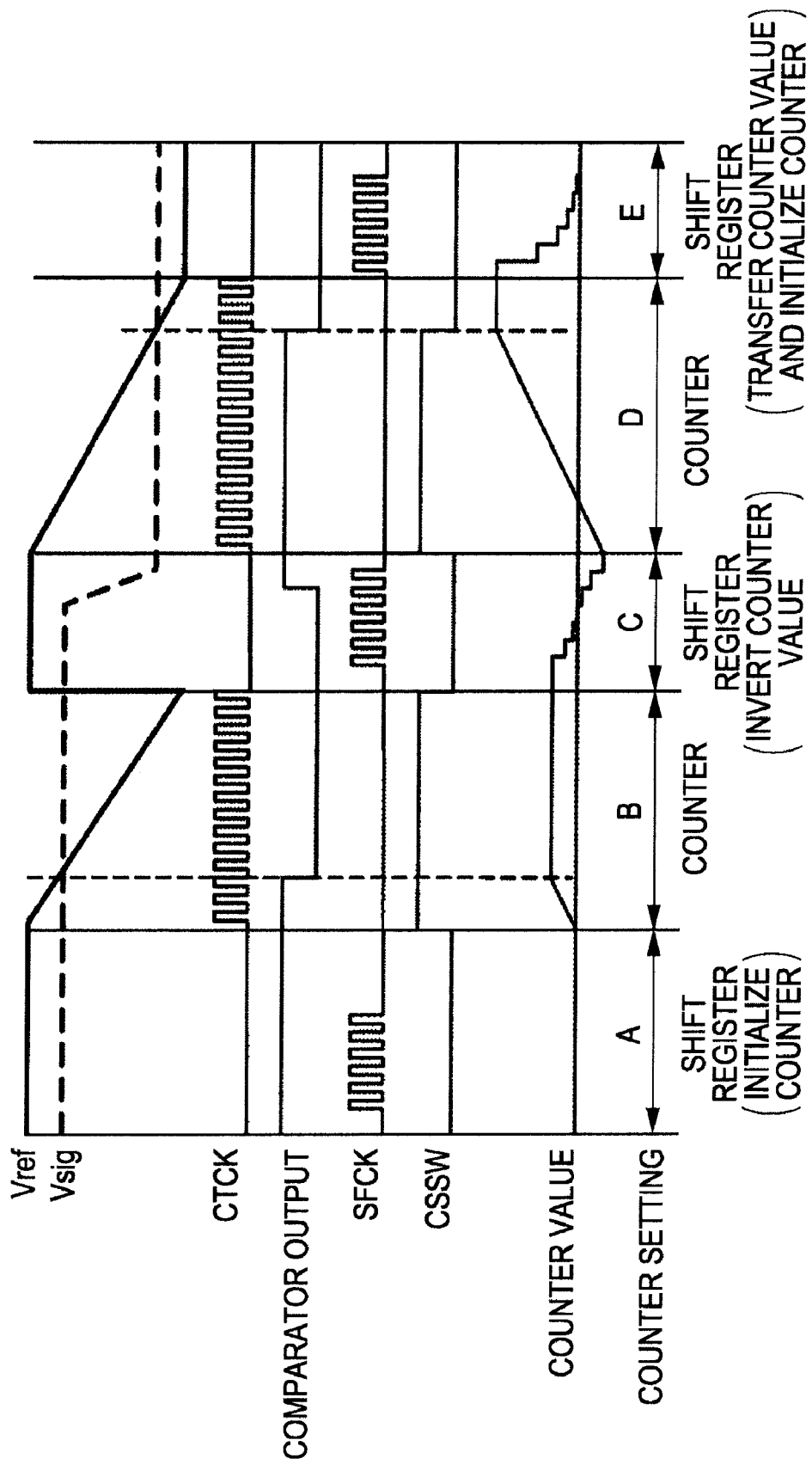
FIG. 7 is a diagram showing an example of a timing chart in the case where the ADC with the first structure performs digital CDS.

FIG. 7 is a diagram showing an example of a timing chart in the case where the ADC with the first structure performs digital CDS.

Hereinafter, a digital CDS operation performed in the ADC with the first structure will be described with reference to FIG. 7.

Operation

First, the counter 220 is initialized in a period A.

On this occasion, the switching signal CSSW at a low level that indicates the shift register mode is input from the terminal T2. In response to this, the switch 264 is turned ON, and the counter initial value CTIV is input from the terminal T3. In response to this, the counter 220 performs a shift register operation synchronized with the shift register clock signal SFCK, and the flip flops FF0 to FF(N−1) are initialized to the initial value.

In a period B, P-phase counting is performed.

The switching signal CSSW at a high level that indicates the counter mode is input. In response to this, the counter 220 performs a count operation synchronized with the counter clock signal CTCK output from the 2-input AND gate 250.

In this case, the comparator 210 compares the reference wave Vref with the pixel signal Vsig, and the counter 220 performs the count operation until the pixel signal Vsig reaches the level of the reference wave Vref, for example. When the pixel signal Vsig intersects the reference wave Vref, the comparator 210 switches its output level from high level to low level, and the count operation is terminated.

Next, in a period C, the counter 220 performs a shift register operation, and outputs a counter value, which is input to the input terminal via the inverter 240, thus inverting the counter value.

On this occasion, the switching signal CSSW at a low level that indicates the shift register mode is input from the terminal T2. In response to this, the switch 261 is turned ON, and the output of the counter 220 is inverted by the inverter 240. The inverted counter value is input via the switch SW10 to the counter 220. The counter 220 performs a shift register operation synchronized with the shift register clock signal SFCK and inverts the counter value.

Next, in a period D, D-phase counting is performed.

The switching signal CSSW at a high level that indicates the counter mode is input. In response to this, the counter 220 performs a count operation synchronized with the counter clock signal CTCK output from the 2-input AND gate 250.

Also in this case, the comparator 210 compares the reference wave Vref with the pixel signal Vsig, and the counter 220 performs a count operation until the pixel signal Vsig reaches the level of the reference wave Vref. When the pixel signal Vsig intersects the reference wave Vref, the comparator 210 switches its output level from high level to low level, and the count operation is terminated. At this time, the switching signal CSSW is switched to low level.

Next, in a period E, the CDS-processed counter value is output.

On this occasion, the switch 261, 262, or 263 is turned ON. The counter 220 performs a shift register operation synchronized with the shift register clock signal SFCK and transfers the counter value. Also, the above-described counter 220 is initialized.

Although no specific examples of use of the first N-bit memory 231 and the second N-bit memory 232 have been given in the foregoing description of the operation, the memories 231 and 232 can be used in the following manner:

1) The counter 220 performs a shift register operation and outputs a counter value, and the counter value is stored in the memories 231 and 232. The stored data is input to the input terminal via the inverter 240, thus inverting the counter value; and 2) The CDS-processed counter value is transferred to the memories 231 and 232.

Advantages

According to the above-described ADC 200, the ADC 200 and the memories 231 and 232 can input/output a value to/from each other.

An operation on a value obtained by the ADC 200 can be performed by performing shifting with the shift register, and the result thereof can be sent back to the ADC 200.

An operation on a value obtained by the ADC 200 and a value stored in each of the memories 231 and 232 can be performed, and the result value can be stored in the ADC 200 (counter 220) or each of the memories 231 and 232.

No inverter is necessary for each bit, and digital CDS can be performed using a single inverter. Therefore, digital CDS can be performed with a simpler circuit structure.

When this ADC 200 is applied to a column-ADC solid-state image pickup device, an output signal from a pixel is input as the input signal Vsig shown in FIG. 3 to the comparator 210, and a signal generated by the DAC 160 is input as the reference signal Vref to the comparator 210. Also, a data output is input to the amplifier circuit 170 of the solid-state image pickup device.

In this case, operations on values obtained by multiple ADCs 200 can be mutually performed, and the result values can be stored in the ADCs 200 or the memories 231 and 232.

Second Exemplary Structure

Figure 8:
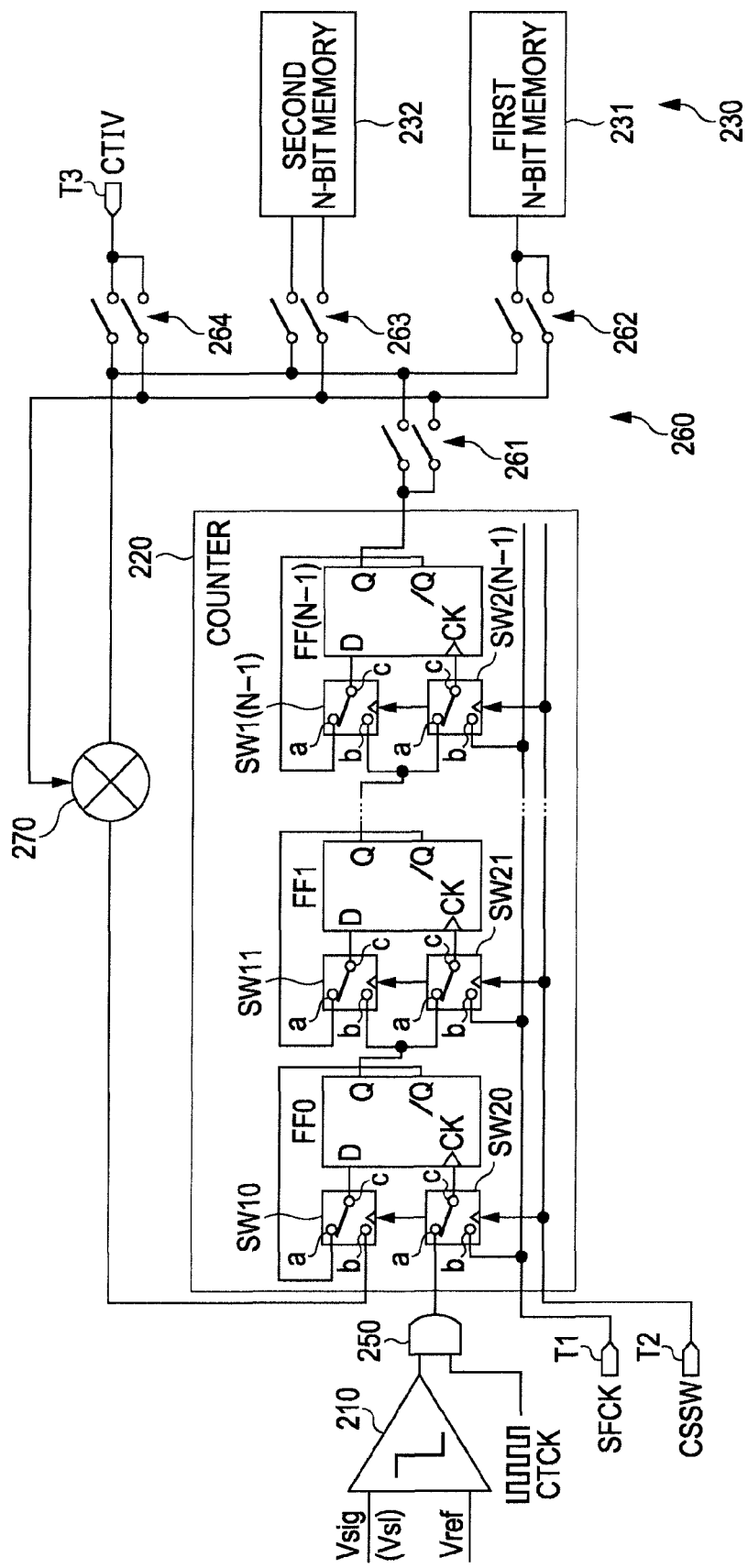
FIG. 8 is a circuit diagram showing a second exemplary structure of the ADC according to the embodiment.

FIG. 8 is a circuit diagram showing a second exemplary structure of the ADC according to the embodiment.

An ADC 200A with the second exemplary structure is different from the ADC 200 with the first exemplary structure in that a 1-bit processor 270 is provided in place of the inverter 240.

In this case, for example, an offset value can be entered from the outside to a counter initial value input.

In addition, a temporarily-shifted offset value can be entered from an external memory to the counter initial value input.

Operation

R-R addition and B-B addition will be described as examples of addition of temporarily-shifted data.

An R-pixel signal is read as Vsig, input to the comparator 210, and the data is stored in the first N-bit memory 231.

Similarly, a B-pixel signal is read, input to the comparator 210, and the data is stored in the second N-bit memory 232.

Next, another R-pixel signal is read, input to the comparator 210, and the data is added to the data stored in the first N-bit memory 231 using the 1-bit processor 270.

The sum data is output as a sum-R signal.

The same is performed for B-pixel signals, and the sum data is output as a sum-B signal.

Advantages

According to the above-described ADC 200A, an operation on a value obtained by the ADC 200A can be performed by the 1-bit processor 270 or by performing shifting with the shift register, and the result thereof can be sent back to the ADC 200A.

An operation on a value obtained by the ADC 200A and a value stored in each of the memories 231 and 232 can be performed, and the result value can be stored in the ADC 200A or each of the memories 231 and 232.

Operations on values obtained by multiple ADCs 200A can be mutually performed, and the result values can be stored in the ADCs 200A or the memories 231 and 232.

According to the embodiment, unlike the related art that is incapable of performing multiplication and division, multiplication and division can be performed using a simple structure. Doubling and quadrupling can be performed by bit shifting. In addition, according to the embodiment, tripling can also be performed.

In the related art, for example, addition of 10-bit data and 10-bit data can be performed using an 11-bit adder. However, according to the embodiment, such addition can be performed using a 1-bit adder.

Third Exemplary Structure

Figure 9:
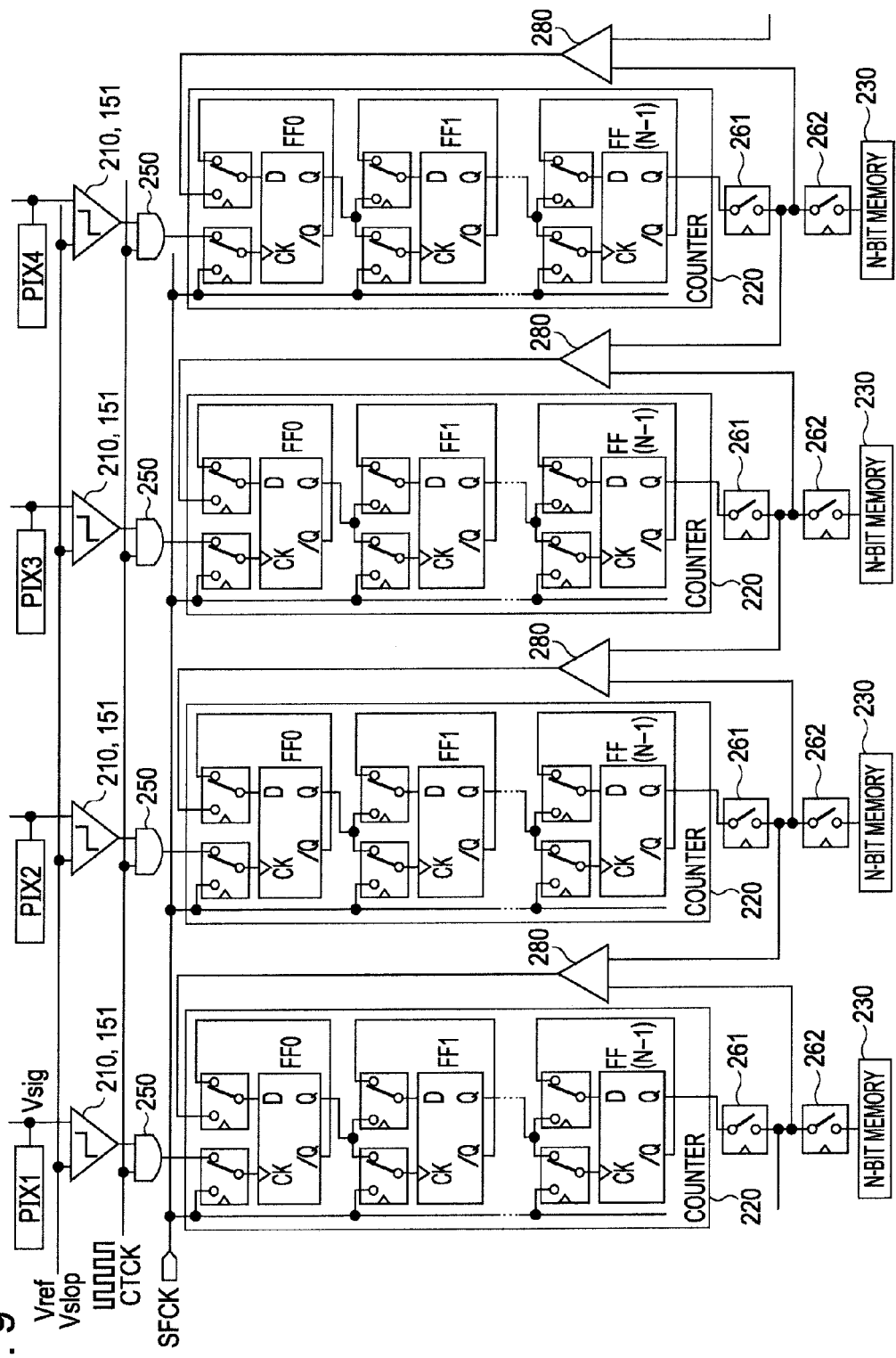
FIG. 9 is a circuit diagram showing a third exemplary structure of the ADC according to the embodiment.

FIG. 9 is a circuit diagram showing a third exemplary structure of the ADC according to the embodiment.

In the third exemplary structure, the ADC 200A with the second exemplary structure is placed in each column, and outputs of the counters 220 in the adjacent ADCs 200A are input to the 1-bit processor 270, which is a digital processor.

Figure 10:
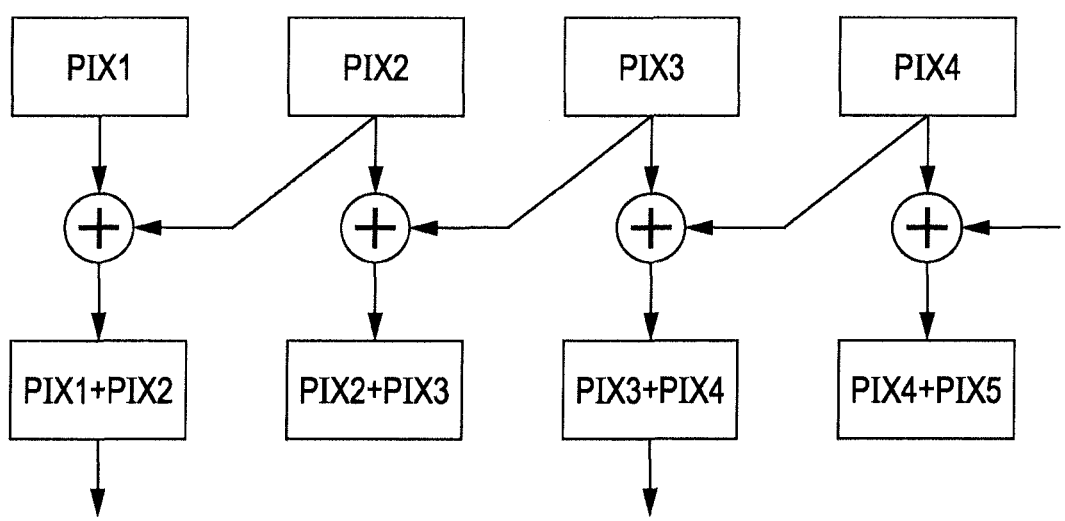
FIG. 10 is a diagram for illustrating changes in a counter internal value in the case where addition is performed between columns (addition of signals of adjacent pixels) using the structure shown in FIG. 9.

FIG. 10 is a diagram for illustrating changes in a counter internal value in the case where addition is performed between columns (addition of signals of adjacent pixels) using the structure shown in FIG. 9.

In FIGS. 9 and 10, PIX1, PIX2, PIX3, PIX4, and PIX5 individually denote pixel signals.

Operation

A first-column pixel signal PIX1 is input to the first-column counter 220 (counter 152 in FIG. 3). Similarly, second-, third-, and fourth-column pixel signals PIX2, PIX3, and PIX4 are input to second-, third-, and fourth-column counters 220, respectively.

Using the 1-bit processor 270, the pixel signal stored in the counter 220 in each column is added to the pixel signal stored in the counter 220 in the adjacent column.

Accordingly, items of data in the first-, second-, third-, and fourth-column counters 200 become PIX1+PIX2, PIX2+PIX3, PIX3+PIX4, and PIX4+PIX5, respectively.

Only the items of data in the first- and third-column counters 220, namely, PIX1+PIX2 and PIX3+PIX4, are read. That is, data is read from alternate columns.

Advantages

Even when the foregoing pixel addition is performed, it is only necessary to read data from alternate columns, whereby high-speed reading can be performed.

That is, when pixel addition is performed between adjacent columns using the related art, it is necessary to read data from all columns. In addition, logic circuits corresponding to all columns are necessary to be activated. As a result, it takes about twice longer to perform reading.

In contrast, according to the embodiment, the amount of data to be read can be reduced, and hence, high-speed reading that is twice faster than that in the related art can be performed.

Also, the ADC 200A and the memory 230 can input/output a value to/from each other.

An operation on a value obtained by the ADC 200A can be performed by the 1-bit processor 270 or by performing shifting with the shift register, and the result thereof can be sent back to the ADC 200A.

An operation on a value obtained by the ADC 200A and a value stored in the memory 230 can be performed, and the result value can be stored in the ADC 200A or the memory 230.

Operations on values obtained by multiple ADCs 200A can be mutually performed, and the result values can be stored in the ADCs 200A or the memories 230.

According to the embodiment, unlike the related art that is incapable of performing multiplication and division, multiplication and division can be performed using a simple structure. Doubling and quadrupling can be performed by bit shifting. In addition, according to the embodiment, tripling can also be performed.

Using this characteristic, an image sensor using column-ADCs can perform the following:

Characteristic variations of ADCs can be corrected by the ADCs, and correction performed outside the image sensor becomes unnecessary (in the related art, correction is performed by a digital signal processor (DSP) at a subsequent stage, or by a special circuit dedicated to performing correction); and Column-direction addition can be performed quickly, and, with the addition, column-direction data can be reduced, whereby high-speed reading is made possible.

Fourth Exemplary Structure

A fourth exemplary structure is similar to the third exemplary structure.

Operation

In the fourth exemplary structure, the case where signals are added in every other row using a memory will be described.

A corresponding one of first-row pixel signals is input to the counter 220 (counter 152 in FIG. 3) in each column.

The first-row pixel signal stored in the counter 220 is moved to the memory 230.

A corresponding one of second-row pixel signals is input to the counter 220 in each column.

The first-row pixel signal stored in the memory 230 is moved to the 1-bit processor 270, and the second-row pixel signal is moved to the memory 230.

A corresponding one of third-row pixel signals is input to the counter 220 in each column, and, using the 1-bit processor 270, the first-row pixel signal is input to the counter 220 in each column. Accordingly, the first- and third-row pixel signals are added.

The sum pixel signal, which is obtained by adding the first- and third-row pixel signals, is output.

A similar operation is performed for the second and fourth rows.

Advantages

In the related art, all pixel signals are read, and the read signals are added by a logic circuit at a subsequent stage. As a result, it takes time to perform reading and addition. In contrast, according to the embodiment, signals can be added inside the column ADCs. Accordingly, high-speed reading can be performed.

As has been described above, according to this embodiment, a solid-state image pickup device includes the pixel section 110 in which a plurality of pixels that perform photoelectric conversion are arranged in a matrix, and the pixel-signal reading circuit (ADC group) 150 which reads data from the pixel section 110 on a row-by-row basis. The ADC group (pixel-signal reading circuit) 150 includes the comparators 151 arranged in correspondence with respective columns of the matrix of the pixels, each of the comparators 151 comparing the potential of a read signal with a reference voltage and outputting a determination signal; the counters 152 whose operation is controlled by outputs of the comparators 151, respectively, each of the counters 152 counting a comparison time of a corresponding one of the comparators 151; and the latches 230 each including the first N-bit memory 231 and the second N-bit memory 232. Each counter 152 is implemented as the N-bit counter 220 (152) with a serial input/output function. An output of the counter 220 is input via the inverter 240 or the 1-bit processor 270 to an input of the counter 220. Therefore, the following advantages can be achieved:

The ADC 200A and the memory 230 can input/output a value to/from each other;

An operation on a value obtained by the ADC 200A can be performed by the 1-bit processor 270 or by performing shifting with the shift register, and the result thereof can be sent back to the ADC 200A;

An operation on a value obtained by the ADC 200A and a value stored in the memory 230 can be performed, and the result value can be stored in the ADC 200A or the memory 230;

Operations on values obtained by multiple ADCs 200A can be mutually performed, and the result values can be stored in the ADCs 200A or the memories 230; and According to the embodiment, unlike the related art that is incapable of performing multiplication and division, multiplication and division can be performed using a simple structure. Doubling and quadrupling can be performed by bit shifting. In addition, according to the embodiment, tripling can also be performed.

Using this characteristic, an image sensor using column-ADCs can perform the following:

Characteristic variations of ADCs can be corrected by the ADCs, and correction performed outside the image sensor becomes unnecessary (in the related art, correction is performed by a digital signal processor (DSP) at a subsequent stage, or by a special circuit dedicated to performing correction); and Column-direction addition can be performed quickly, and, with the addition, column-direction data can be reduced, whereby high-speed reading is made possible.

In the related art, all pixel signals are read, and the read signals are added by a logic circuit at a subsequent stage. As a result, it takes time to perform reading and addition. In contrast, according to the embodiment, signals can be added inside the column ADCs. Accordingly, high-speed reading can be performed.

In the related art, counters used in column-ADCs output counter values in parallel. Therefore, the wiring of bus to which the counter values are output becomes complicated. In order to set an arbitrary initial value, the size of the circuitry is increased. In contrast, according to the embodiment, the foregoing functions are made possible without increasing the size of the circuitry.

The solid-state image pickup device with these advantages is applicable as an image pickup device in a digital camera or a video camera.

Figure 11:
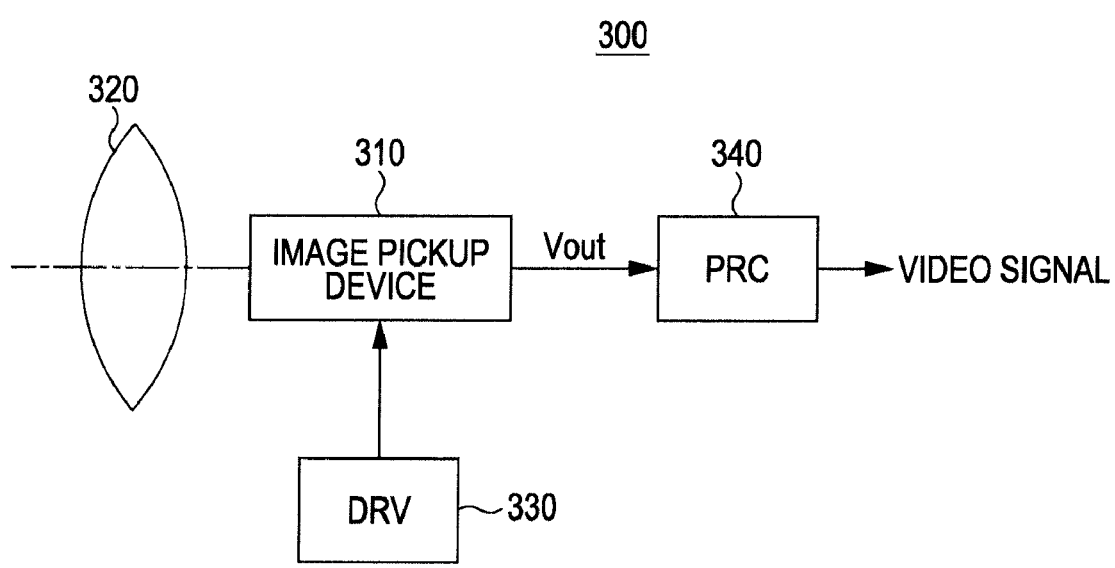
FIG. 11 is a diagram showing an exemplary structure of a camera system to which a solid-state image pickup device according to an embodiment of the present invention is applied.

FIG. 11 is a diagram showing an exemplary structure of a camera system to which a solid-state image pickup device according to an embodiment of the present invention is applied.

A camera system 300 includes, as shown in FIG. 11, an image pickup device 310 to which the solid-state image pickup device according to the embodiment is applicable, an optical system that directs incident light to a pixel region of the image pickup device 310 (that forms an image of a subject), a lens 320 that forms an image from the incident light on an image pickup face, a drive circuit (DRV) 330 that drives the image pickup device 310, and a signal processing circuit (PRC) 340 that processes an output signal of the image pickup device 310.

The drive circuit 330 includes a timing generator (not shown in FIG. 16) that generates various timing signals including a start pulse that drives circuits in the image pickup device 310, and a clock pulse. The drive circuit 330 drives the image pickup device 310 using a predetermined timing signal.

An image signal processed in the signal processing circuit 340 is recorded on a recording medium, such as a memory. A hard copy of the image information recorded on the recording medium is generated using a printer or the like. Also, the image signal processed in the signal processing circuit 340 is displayed as a moving image on a monitor including a liquid crystal display or the like.

As has been described above, an image pickup apparatus such as a digital still camera includes the above-described solid-state image pickup device 100 serving as the image pickup device 310, thereby realizing a highly precise camera.

The present application contains subject matter related to that disclosed in Japanese Priority Patent Application JP 2008-070011 filed in the Japan Patent Office on Mar. 18, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An analog-to-digital converter that converts an analog input signal into a digital signal, comprising:
a comparator configured to compare a reference signal with an input signal and the comparator changes an output state when it is determined that the reference signal and the input signal have a predetermined relationship; and
a counter configured to count pulses in order to determine a value of the reference signal when the comparator output state changes,
wherein the counter includes a plurality of flip flops that can perform serial input/output, an input and an output of the counter are connected to each other, and the counter can operate in accordance with a counter mode and a shift register mode, wherein, in the counter mode, a data output of each of the plurality of flip flops is supplied to a clock input of a flip flop at a next stage, and, if the output of the comparator is at a predetermined level, the counter functions as a counter synchronized with a counter clock signal, and wherein, in the shift register mode, the plurality of flip flops are cascade-connected, and the counter functions as a shift register synchronized with a shift register clock signal.

2. The analog-to-digital converter according to claim 1, further comprising an inverter on a connection line between the output and the input of the counter.

3. The analog-to-digital converter according to claim 2, further comprising a latch connected via a switch to an output side of the plurality of flip flops.

4. The analog-to-digital converter according to claim 3, wherein an initial value of the counter can be selectively input to the connection line.

5. The analog-to-digital converter according to claim 1, further comprising a digital processor on a connection line between the output and the input of the counter.

6. The analog-to-digital converter according to claim 5, further comprising a latch connected via a switch to an output side of the plurality of flip flops.

7. The analog-to-digital converter according to claim 5, wherein an initial value of the counter can be selectively input to the connection line.

8. A solid-state image pickup device comprising:
a pixel section including a plurality of pixels arranged in a matrix, the plurality of pixels performing photoelectric conversion; and
a pixel-signal reading circuit configured to read pixel signals from the pixel section,
wherein the pixel-signal reading circuit includes
a plurality of comparators arranged in correspondence with respective columns of the matrix of the plurality of pixels, each of the plurality of comparators comparing a voltage of a corresponding read signal input to the comparator with a voltage of a reference signal, and the comparator changes an output state when it is determined that the reference signal and the input signal have a predetermined relationship, and
a plurality of counters whose operation is controlled in accordance with the outputs of the plurality of comparators, respectively, each of the plurality of counters counting pulses in order to determine a value of the reference signal when the corresponding comparator output state changes,
wherein each of the plurality of counters includes a plurality of flip flops that can perform serial input/output, an input and an output of the counter are connected to each other, and the counter can operate in accordance with a counter mode and a shift register mode,
wherein, in the counter mode, a data output of each of the plurality of flip flops is supplied to a clock input of a flip flop at a next stage, and, if the output of the comparator is at a predetermined level, the counter functions as a counter synchronized with a counter clock signal, and
wherein, in the shift register mode, the plurality of flip flops are cascade-connected, and the counter functions as a shift register synchronized with a shift register clock signal.

9. The solid-state image pickup device according to claim 8, further comprising an inverter on a connection line between the output and the input of the counter.

10. The solid-state image pickup device according to claim 9, further comprising a latch connected via a switch to an output side of the plurality of flip flops.

11. The solid-state image pickup device according to claim 10, wherein an initial value of the counter can be selectively input to the connection line.

12. The solid-state image pickup device according to claim 8, further comprising a digital processor on a connection line between the output and the input of the counter.

13. The solid-state image pickup device according to claim 12, further comprising a latch connected via a switch to an output side of the plurality of flip flops.

14. The solid-state image pickup device according to claim 13, wherein an initial value of the counter can be selectively input to the connection line.

15. The solid-state image pickup device according to claim 13, further comprising a plurality of adders configured to add outputs of counters in adjacent columns.

16. A camera system comprising:
a solid-state image pickup device; and
an optical system that forms an optical image of a subject on the solid-state image pickup device,
wherein the solid-state image pickup device includes
a pixel section including a plurality of pixels arranged in a matrix, the plurality of pixels performing photoelectric conversion, and
a pixel-signal reading circuit configured to read pixel signals from the pixel section in increments of multiple pixels,
wherein the pixel-signal reading circuit includes
a plurality of comparators arranged in correspondence with respective columns of the matrix of the plurality of pixels, each of the plurality of comparators comparing a voltage of a corresponding read signal input to the comparator with a voltage of a reference signal, and the comparator changes an output state when it is determined that the reference signal and the input signal have a predetermined relationship, and
a plurality of counters whose operation is controlled in accordance with the outputs of the plurality of comparators, respectively, each of the plurality of counters counting pulses in order to determine a value of the reference signal when the corresponding comparator output state changes,
wherein each of the plurality of counters includes a plurality of flip flops that can perform serial input/output, an input and an output of the counter are connected to each other, and the counter can operate in accordance with a counter mode and a shift register mode,
wherein, in the counter mode, a data output of each of the plurality of flip flops is supplied to a clock input of a flip flop at a next stage, and, if the output of the comparator is at a predetermined level, the counter functions as a counter synchronized with a counter clock signal, and
wherein, in the shift register mode, the plurality of flip flops are cascade-connected, and the counter functions as a shift register synchronized with a shift register clock signal.

* * * * *